United States Patent [19]
Grill et al.

[11] Patent Number: 6,030,904
[45] Date of Patent: Feb. 29, 2000

[54] STABILIZATION OF LOW-K CARBON-BASED DIELECTRICS

[75] Inventors: Alfred Grill, White Plains; Christopher Vincent Jahnes, Monsey; Vishnubhai Vitthalbhai Patel, Yorktown Heights; Katherine Lynn Saenger, Ossining, all of N.Y.

[73] Assignee: International Business Machines Corporation, Armonk, N.Y.

[21] Appl. No.: 08/916,001

[22] Filed: Aug. 21, 1997

[51] Int. Cl.[7] .................................................. H01L 21/477
[52] U.S. Cl. ........................ 438/781; 438/623; 438/624; 438/778; 438/780
[58] Field of Search .................................. 438/781, 623, 438/624, 778, 780; 148/DIG. 3

[56] References Cited

U.S. PATENT DOCUMENTS

| | | | |
|---|---|---|---|
| 4,647,494 | 3/1987 | Meyerson et al. | 428/216 |
| 4,965,134 | 10/1990 | Ahne et al. | 438/781 |
| 5,059,448 | 10/1991 | Chandra et al. | 438/781 |
| 5,320,983 | 6/1994 | Ouellet | 438/781 |
| 5,376,586 | 12/1994 | Beilin et al. | 438/781 |
| 5,462,784 | 10/1995 | Grill et al. | 428/65.5 |
| 5,470,661 | 11/1995 | Bailey et al. | 428/408 |
| 5,514,885 | 5/1996 | Myrick | 257/216 |
| 5,559,367 | 9/1996 | Cohen et al. | 257/77 |
| 5,789,325 | 8/1998 | Chandra et al. | 438/781 |

OTHER PUBLICATIONS

S.F. Carr et al. "High Temperature Diamond Thin Film For Capacitor", IEEE, pp. 271–275, 1995.

Matsubara et al. Low–K Fluorinated Amorphous Carbon Interlayer Technology for Quarter Micron Devices, IEEE, pp. 14.6.1—14.6.4, 1996.

Kopp et al. "simultaneous Formation of Emitter and Passivation Layer in a Single Rapid Thermal Cycle", IEEE, pp. 1527–1530, Dec. 1994.

Grill et al "Diamond–like carbon materials as low epsilon diectrics for multilevel interconnects in ULSI" Mat. Res. Soc. Symp. Proc. 443 443, 155 (1997).

A. Grill & B.S. Meyerson, "Development and Status of Diamond–like Carbon" Chapter 5 in *Synthetic Diamond: Emerging CVD Science and Technology*, editors K.E. Spear and J.P. Dismukes, John Wiley & Sons, New York (1994).

Saenger et al "Etch Stop and Electrical Properties of Si–Containing Diamond–like Carbon" Conf. Proc. ULSI XII (Materials Research Soc.) 499 (1997).

Grill et al Diamondlike Carbon Materials as Low-k Dielectrics Conference Proceedings ULSI (Materials Research Soc.) 417 (1997).

*Primary Examiner*—Carl Whitehead, Jr.
*Assistant Examiner*—Maria Guerrero
*Attorney, Agent, or Firm*—Robert M. Trepp

[57] ABSTRACT

A method for treating a film of carbon-based dielectric material such as diamond-like carbon to remove volatiles is described. The method incorporates the steps of providing a non-oxidizing ambient and heating the film above 350° C. Heating may be by rapid thermal annealing. The dielectric constant of the material may be lowered. A stabilized carbon-based material is provided with less than 0.5% thickness or weight change/hour at a selected temperature at or below 400° C. The invention overcomes the problem of dimensional instability during the incorporation of the material in integrated circuit chips as an intra and inter level dielectric.

12 Claims, 2 Drawing Sheets

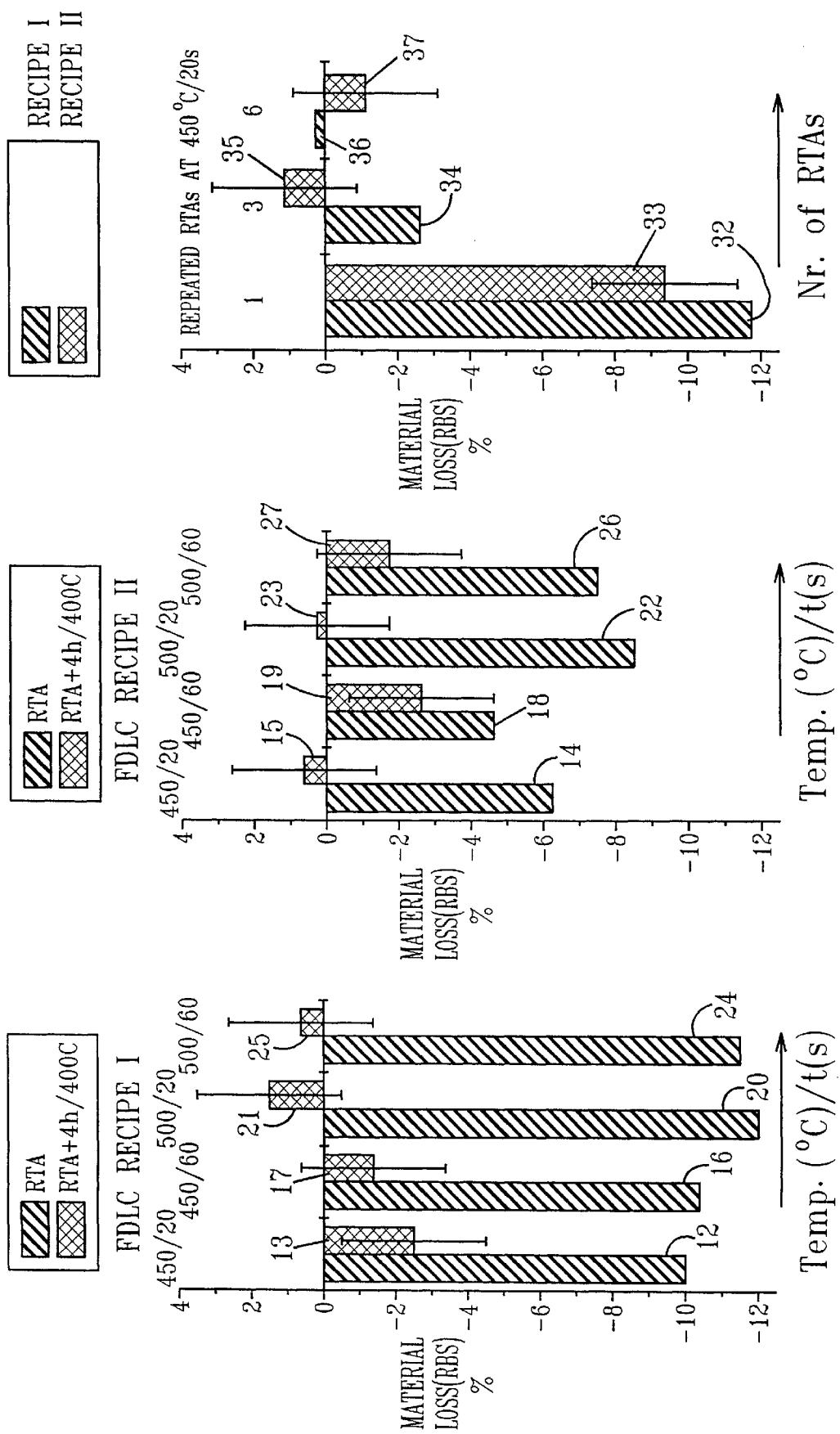

STABILIZATION OF LOW-K CARBON-BASED DIELECTRICS

FIELD OF THE INVENTION

The present invention relates to carbon-based dielectrics that require stabilization before they can be reliably incorporated into structures subsequently exposed to elevated temperatures. More particularly, this invention relates to a process for stabilizing carbon-based insulators such as diamond-like amorphous hydrogenated carbon (a—C:H), fluorinated diamond-like carbon (a—C:F:H), and their additive-containing derivatives so that these carbon-based materials may be used as low-k dielectrics in interconnect structures found in Very Large Scale Integrated (VLSI) and Ultra Large Scale Integrated (ULSI) circuits and packaging.

BACKGROUND OF THE INVENTION

Amorphous hydrogenated carbon (a—C:H), also known as diamond-like carbon (DLC) because of its hardness, has many useful properties such as chemical inertness, high wear resistance, high resistivity, and low dielectric constant (k<3.2) such as described by Meyerson et al. in U.S. Pat. No. 4,647,494 which issued Mar. 3, 1987, Grill et al. in U.S. Pat. No. 5,462,784 which issued Oct. 31, 1995 and A. Grill and B. S. Meyerson, "Development and Status of Diamond-like Carbon", Chapter 5, in *Synthetic Diamond: Emerging CVD Science and Technology*, editors K. E. Spear and J. P. Dismukes, John Wiley and Sons, New York 1994. DLC films can be fabricated by a variety of methods including sputtering, ion beam sputtering, and dc or rf plasma assisted chemical vapor deposition with a variety of carbon-bearing source materials such as described above and by F. D. Bailey et al. in U.S. Pat. No. 5,470,661 which issued Nov. 28, 1995.

A number of useful DLC analogues may be synthesized by replacing some of the carbon or hydrogen in the a—C:H with other elements. For example, silicon-containing diamond-like carbon (SiDLC), a DLC analogue with 5–10% C replacement by Si, has a much higher resistance to oxygen-based reactive ion etching (RIE) than unmodified DLC. Fluorinated diamond like carbon (FDLC or a—C:F:H), a DLC analogue in which some or most of the H is replaced by F, has lower stresses than DLC as well as a lower dielectric constant (k<2.8). Other additives to DLC or FDLC may include nitrogen, oxygen, germanium, and metallic elements.

The low dielectric constants of DLC and FDLC make them potentially useful as insulator materials in high performance VLSI and ULSI chips where interconnect wiring capacitance must be minimized. This use for DLC and FDLC is discussed by S. A. Cohen et al. in U.S. Pat. No. 5,559,367 which issued Sep. 24, 1996, entitled "Diamond-like carbon for use in VLSI and ULSI interconnect systems." However, these diamond-like materials can have high stresses and can change dimensionally after heating, making them difficult to use in their as-deposited form. For example, the high stresses in as-deposited DLC films can be high enough to produce a wafer bowing that interferes with lithography. Furthermore, since fabrication of back-end-of the line (BEOL) interconnect structures typically includes a final passivation anneal at 400° C. for 4 hours, insulators used in these structures must be stable to such treatment.

A common requirement for film stability is that film weight loss per hour be less than 0.5% at a selected temperature at or below 400° C. The use of films not meeting this requirement may cause a number of problems in BEOL interconnect structures. Annealing-induced film shrinkage or expansion may change the final film dimensions, or in constrained films, put unacceptable stresses on the wiring structures. Film decomposition products produced during annealing may outgas and produce delamination and/or cracking, especially in multilayer structures.

While film thermal stability may be improved by adjusting the deposition conditions, such improvements typically come with the expense of undesirably higher dielectric constants, as reported by Grill et al. in "Diamond-like carbon materials as low epsilon dielectrics for multilevel interconnects in ULSI", Mat. Res. Soc. Symp. Proc. 443 xxx (1997).

It is thus an object of this invention to provide a method for stabilizing carbon-based insulating films such as DLC and FDLC.

It is a further object of this invention to provide a stabilization method that is effective and economical in time and cost.

It is still a further object of this invention to provide a stabilization method which may also act to lower the dielectric constant of carbon-based insulating films such as DLC and FDLC.

SUMMARY OF THE INVENTION

The present invention relates to carbon-based insulating materials that require stabilization before they can be reliably incorporated into structures subsequently exposed to elevated temperatures. More particularly, this invention relates to a rapid thermal annealing (RTA) process for stabilizing such materials so that they may be used as low-k dielectrics in interconnect structures found in Very Large Scale Integrated (VLSI) and Ultra Large Scale Integrated (ULSI) circuits and packaging. RTA stabilization processes, applied to the deposited films before they are fully integrated into the interconnect structure, allow fine-tuned, targeted heating with minimal thermal burden to structural elements that need no further annealing.

The invention further provides a method for lowering the dielectric constant of certain carbon-based dielectrics.

DESCRIPTION OF THE DRAWINGS

FIGS. 1A–1C show indirect weight loss data for FDLC films treated by the RTA stabilization processes of the present invention;

DESCRIPTION OF THE PREFERRED EMBODIMENTS

Figure 2A:
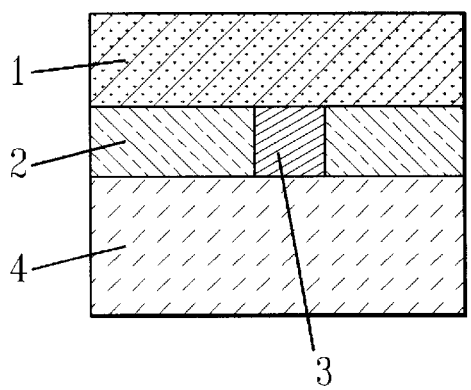
FIGS. 2A–2F are cross section views illustrating the steps by which the disclosed stabilization process may be incorporated into a Dual Damascene fabrication process for interconnect structures.
Figure 2B:
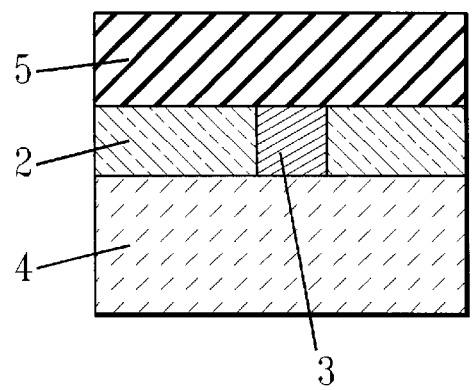

The present invention relates to a rapid thermal annealing (RTA) process for stabilizing low-k carbon-based dielectrics before they are completely integrated into BEOL wiring structures. Examples of low-k carbon-based dielectrics to which this RTA stabilization process may be applied include parylenes, benzocyclobutane (BCB), DLC, FDLC, DLC or FDLC containing one or more additives selected from the group containing oxygen, silicon, germanium, nitrogen, and all metallic elements, and as well as layered combinations of any of these diamond-like materials. The RTA stabilization process may also lower the k values of certain carbon-based dielectrics. The degree to which this may be viewed as a desirable side effect or as the primary process motivator depends on the relative importances of increased film dimensional stability and decreased film dielectric constant. The RTA stabilization process may additionally alter other physical properties of the film such as hardness and stress. Again, the degree to which this may be viewed as a desirable side effect or the primary process motivator depends on the relative importance of the film properties in question.

The annealing conditions are preferably optimized for each film type (e.g., DLC or FDLC) but typically comprise the steps of heating the film in a vacuum or a non-oxidizing ambient by ramping the film to a temperature above 350° C. and continuing said step of heating for a time sufficient to provide a dimensionally stable film or to remove the undesired volatile components (volatiles) of the film. The film or layer is subsequently cooled back down to room temperature around 23° C. or to the temperature required for the next processing step.

The preferred temperature above 350° C. is in the range from 350° C. to 600° C. and the preferred duration of continuing the step of heating is in the range from 1 sec to 10 min. The preferred ramp rate is in the range from 1 to 100° C./sec, more preferably in the range from 10 to 50° C./sec. The preferred non-oxidizing ambient is selected from the group of gases consisting of nitrogen, argon, helium, hydrogen, and mixtures thereof. The term vacuum should be taken to include any sub-atmospheric pressure non-oxidizing ambient as well as environments in which the partial pressure of any oxidant is below 10 Torr and preferably below 1 mTorr. The rapid thermal annealing may take place in a single wafer tool in which the annealing process is performed on one wafer at a time, or in a multiple wafer tool in which the annealing process is performed on two or more wafers at a time.

FIGS. 1A–1C show indirect weight loss data for FDLC films treated by the RTA stabilization processes of the present invention. In the present context of the materials DLC and FDLC, the words "stabilized, stabilizing, and stabilization" relate to the achievement of a substantial constancy of film dimensions, composition, weight, and physical properties during subsequent heating at processing temperatures above the film deposition temperature. Such constancy would typically require the removal of the bulk of any film components that may be driven off or volatilized by heating, such as free hydrogen (typically $H_2$) and/or low molecular weight hydrocarbons and fluorocarbons $C_xH_yF_z$ where x might be an integer in the range 1 to 4 and y and z might be integers in the range 0 to 6. A stabilized film is one wherein the weight and thickness of the film will change by less than 0.5%/hour at a selected processing temperature at or below 400° C.

Film weight loss was indirectly determined by Rutherford Backscattering Spectroscopy (RBS) with 1.8 MeV $^4$He ions in conjunction with film hydrogen content determined by Forward Recoil Scattering (FRES) with 2.3 MeV $^4$He ions. Weight loss measurements were performed after RTA treatment and again after an additional 400° C./4 hr furnace anneal in a He ambient to assess sample stability.

FIG. 1A shows the data for a first type of FDLC film prepared using a first set of parameters or recipe (Recipe I), and FIG. 1B shows the data for a second type of FDLC prepared using a second set of parameters or recipe (Recipe II).

In FIGS. 1A and 1B, the ordinate represents weight loss from a FDLC sample or film and the abscissa represents four types of RTA treatments without and with 4 hours at 400° C. furnace anneal. The four RTA treatments were 450° C./20 s, 450° C./60 s, 500° C./20 s, and 500° C./60 s, all in a nitrogen ambient. Curves 12 and 14 represent RTA treatments at 450° C./20 s. Curves 13 and 15 represent the RTA treatment shown by curves 12 and 14 followed by 4 hours at 400° C. furnace anneal. Curves 16 and 18 represent RTA treatments at 450° C./60 s. Curves 17 and 19 represent the RTA treatment shown by curves 16 and 18 followed by 4 hours at 400° C. furnace anneal. Curves 20 and 22 represent RTA treatments at 500° C./20 s. Curves 21 and 23 represent the RTA treatment shown by curves 20 and 22 followed by 4 hours at 400° C. furnace anneal. Curves 24 and 26 represent RTA treatments at 500° C./60 s. Curves 25 and 27 represent the RTA treatment shown by curves 24 and 26 followed by 4 hours at 400° C. furnace anneal.

In FIG. 1A, the bias voltage $V_b$ on the substrate during enhanced plasma deposition was less than the bias voltage $V_b$ on the substrate in FIG. 1B.

FIGS. 1A and 1B show that all RTA treatments stabilized the films to the required <0.5% weight and/or thickness change per hour of annealing at 400° C., at least to within the plus or minus 2% weight percent scatter in the data.

FIG. 1C shows that the FDLC films are stable to the repeated RTA treatments such as might be experienced by the bottom layer of a multilayer BEOL structure given an anneal each time a new layer is applied. In FIG. 1C, the ordinate represents material loss from a FDLC sample or film as determined by RBS and FRES and the abscissa represents the number of RTA cycles, one, three and six. Curves 32, 34 and 36 show the material loss from FDLC samples prepared by the parameter set of Recipe I. Curves 33, 35, and 37 show the material loss from DLC samples or films prepared by the parameter set of Recipe II. Curves 32 and 33 are for films treated with one RTA cycle at 450° C./20 s. Curves 34 and 35 are for films treated with three RTA cycles at 450° C./20 s and curves 36 and 37 are for films treated with six RTA cycles at 450° C./20 s.

Figure 2C:
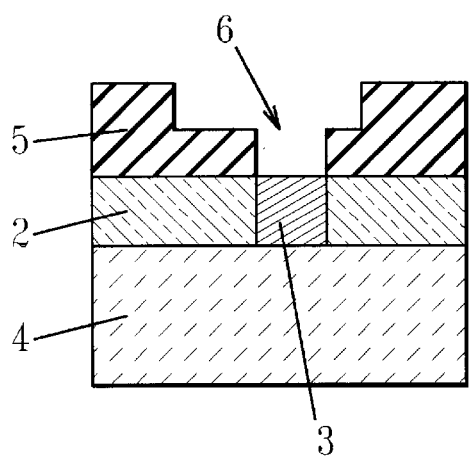
Figure 2D:
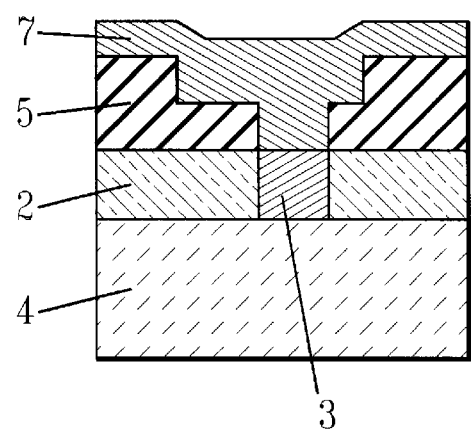
Figure 2E:
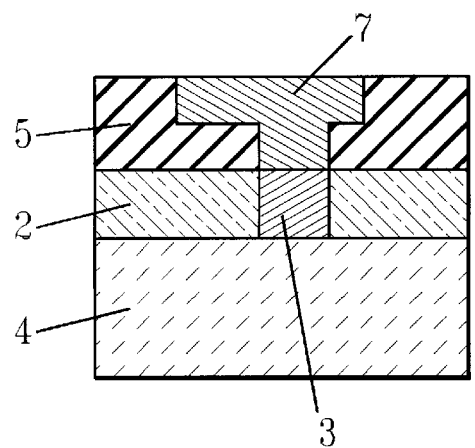
Figure 2F:
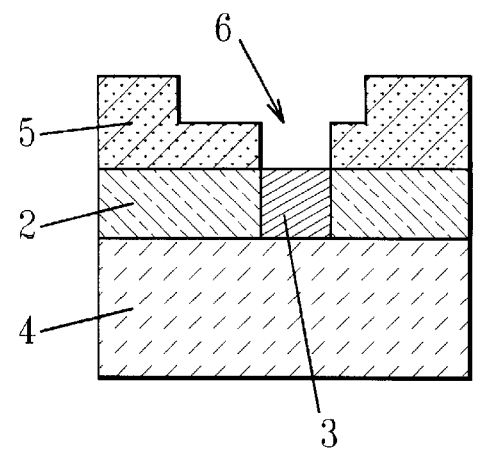

FIGS. 2A–2F are cross section views illustrating the steps by which the disclosed stabilization process may be incorporated into a Dual Damascene fabrication process for interconnect structures. FIG. 2A shows carbon-based dielectric layer 1, for example, DLC or FDLC, deposited on dielectric 2 which may be, for example, silicon dioxide, flowable oxide, or DLC, containing embedded conductive via or leads 3 on substrate 4. Via or conductive lead 3 may have a liner of Ta, Ti, TiN, TaN, TaSiN and a center portion of Al, Al—Cu, Cu, alloys of Cu, or W. Substrate 4 may be a semiconductor for example Si, SiGe, GaAs with devices formed therein such as NMOS, PMOS, CMOS or bipolar (not shown) or substrate 4 may be a layer of dielectric, for example, silicon dioxide, DLC, or ceramic material. Carbon-based dielectric 1 is stabilized by the disclosed RTA stabilization process to produce stabilized dielectric 5 shown in FIG. 2B. Stabilized dielectric 5 is patterned with tracks 6 for vias and wiring as shown in FIG. 2C. Alternatively, the unstabilized carbon-based dielectric 1 of FIG. 2A may be patterned to produce the structure of FIG. 2F, and then stabilized by the disclosed RTA stabilization process to produce the structure of FIG. 2C. Conductive material 7 is deposited in tracks 6 to produce the structure of FIG. 2D, which is planarized to produce the structure of FIG. 2E. Conductive material 7 may have a liner of Ta, Ti, TiN, TaN, TaSiN and a center portion of Al, Al—Cu, Cu or alloys of Cu, or W. The steps of FIGS. 2A through 2E are repeated as necessary to form an interconnect structure with the desired number of wiring and via levels.

The Dual Damascene BEOL fabrication method of FIGS. 2A–2F illustrate just one of the BEOL fabrication methods that might incorporate the RTA stabilization process of the present invention. For example, in non-Damascene fabrication methods for BEOL structures, the carbon-based dielectric would be formed or deposited to surround or cover a preexisting pattern of conductive features, typically a wiring pattern, and then stabilized with the conductive features in place. The stabilization process could be applied before or after any required patterning of the dielectric, such as might be needed to form holes for conductive vias.

Carbon-containing dielectric films stabilized by the stabilization processes of the present invention may also be preferable to non-stabilized or conventionally stabilized films for non-BEOL applications as well. For example, RTA-stabilized films may be useful as:

(i) disposable mask materials temporarily applied to a workpiece during processing, (ii) patterned mask materials on phase shift masks (where stabilization may improve dimensional stability under UV irradiation), (iii) as mask substrates, and (iv) as part of a multilayer coating exposed to high temperatures in the range 350–600° C.

Having thus described our invention, what we claim as new and desire to secure by Letters Patent is:

1. A method for stabilizing a film of carbon-based material comprising the steps of:

selecting a film of carbon based material wherein said carbon based material is selected from the group consisting of amorphous hydrogenated carbon (a—C:H), diamond-like carbon (DLC), fluorinated diamond-like carbon (FDLC), DLC or FDLC containing one or more additives selected from the group consisting of oxygen, silicon, germanium, nitrogen, and all metallic elements, and layered combinations of said diamond-like materials;

heating said film to a temperature above its deposition temperature in an ambient selected from the group consisting of a vacuum and a non-oxidizing gas ambient, said step of heating includes the step of heating by rapid thermal annealing to a temperature in the range from 350° C. to 600° C.; and continuing said step of heating for a time sufficient to dimensionally stabilize said film by removing volatiles from within said film.

2. The method of claim 1 wherein said non-oxidizing gas ambient is selected from the group consisting of nitrogen, argon, helium, hydrogen, and mixtures thereof.

3. The method of claim 1 wherein said step of continuing said step of heating for a time includes the step of heating for less than 10 minutes.

4. The method of claim 1 wherein said step of continuing said step of heating is sufficient to stabilize said film, said stabilized film being one wherein the thickness of said film will change by less than 0.5%/hour at a selected temperature at or below 400° C.

5. The method of claim 1 wherein said step of continuing said step of heating is sufficient to stabilize said film, said stabilized film being one wherein the weight of said film will change by less than 0.5%/hour at a selected temperature at or below 400° C.

6. The method of claim 1 further including the step of selecting a carbon based material having a dielectric constant less than 3.5.

7. The method of claim 1 further including the step of selecting a film having a first dielectric constant $k_1$ and further including the step of terminating said step of continuing said heating at times said film has a second dielectric constant $k_2$ which is less than $k_1$.

8. The method of claim 1 wherein said step of heating by rapid thermal annealing includes raising the temperature at a rate in the range from 1 to 100° C./sec.

9. The method of claim 8 wherein said step of heating by rapid thermal annealing includes the step of placing said film in a single wafer tool in which the annealing process is performed on one wafer at a time.

10. The method of claim 8 wherein said step of heating by rapid thermal annealing includes the step of placing said film in a multiple wafer tool in which the annealing process is performed on two or more wafers at a time.

11. A method of forming a pattern of conductive features embedded in a carbon-based dielectric layer, said method comprising the steps of:

depositing a film of a carbon-based dielectric material on a substrate, wherein said carbon-based dielectric material is selected from the group consisting of amorphous hydrogenated carbon, diamond-like carbon (DLC), fluorinated diamond-like carbon (FDLC), DLC or FDLC containing one or more additives selected from the group consisting of oxygen, silicon, germanium, nitrogen, and all metallic elements, and layered combinations of said diamond-like materials;

heating said film to a temperature above 350° C. in a vacuum or a non-oxidizing ambient, said step of heating includes the step of heating by rapid thermal annealing; and continuing said step of heating for a time sufficient to dimensionally stabilize said film by removing volatiles from within said film;

patterning said film to form cavities; and filling said cavities with a conductive material.

12. A method of forming a pattern of conductive features embedded in a carbon-based dielectric layer, said method comprising the steps of:

depositing a film of carbon-based dielectric material on a substrate, wherein said carbon-based dielectric material is selected from the group consisting of amorphous hydrogenated carbon, diamond-like carbon (DLC), fluorinated diamond-like carbon (FDLC), DLC or FDLC containing one or more additives selected from the group consisting of oxygen, silicon, germanium, nitrogen, and all metallic elements, and layered combinations of said diamond-like materials;

patterning said film to form cavities;

heating said film to a temperature above 350° C. in a vacuum or a non-oxidizing ambient, said step of heating includes the step of heating by rapid thermal annealing; and continuing said step of heating for a time sufficient to dimensionally stabilize said film by removing volatiles from within said film; and filling said cavities with a conductive material.

* * * * *